US 10,490,523 B2

(12) United States Patent
Minotti et al.

(10) Patent No.: US 10,490,523 B2
(45) Date of Patent: *Nov. 26, 2019

(54) SEMICONDUCTOR DEVICE WITH A WIRE BONDING AND A SINTERED REGION, AND MANUFACTURING PROCESS THEREOF

(71) Applicant: STMicroelectronics S.R.L., Agrate Brianza (IT)

(72) Inventors: Agatino Minotti, Mascalucia (IT); Gaetano Montalto, Trecastagni (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/697,704

(22) Filed: Sep. 7, 2017

(65) Prior Publication Data

US 2017/0365577 A1    Dec. 21, 2017

Related U.S. Application Data

(63) Continuation of application No. 14/846,010, filed on Sep. 4, 2015, now Pat. No. 9,786,626.

(30) Foreign Application Priority Data

Nov. 26, 2014    (IT) .............................. TO2014A0975

(51) Int. Cl.
*H01L 23/00*    (2006.01)

(52) U.S. Cl.
CPC .............. *H01L 24/48* (2013.01); *H01L 24/03* (2013.01); *H01L 24/05* (2013.01); *H01L 24/06* (2013.01); *H01L 24/08* (2013.01); *H01L 24/43* (2013.01); *H01L 24/29* (2013.01); *H01L 24/45* (2013.01); *H01L 24/85* (2013.01); *H01L 2224/03438* (2013.01); *H01L 2224/05552* (2013.01);

(Continued)

(58) Field of Classification Search
CPC ......... H01L 24/03; H01L 24/08; H01L 24/43; H01L 24/48; H01L 24/05; H01L 24/45; H01L 2224/05647; H01L 2224/45147; H01L 2224/4847; H01L 2224/48491; H01L 2224/4883; H01L 2924/3511; H01L 2924/3512; H01L 2924/0014

See application file for complete search history.

(56) References Cited

U.S. PATENT DOCUMENTS 6,329,722 B1    12/2001 Shih et al.
9,786,626 B2 *  10/2017 Minotti ................... H01L 24/48

(Continued)

OTHER PUBLICATIONS

Ling et al., "Large Cu Wire Wedge Bonding Process for Power Devices," 13th Electronics Packaging Technology Conference, 5 pgs., 2011.

(Continued)

*Primary Examiner* — Dale E Page
*Assistant Examiner* — Quovaunda Jefferson
(74) *Attorney, Agent, or Firm* — Seed Intellectual Property Law Group LLP

(57) ABSTRACT

An electronic device includes: a semiconductor body; a front metallization region; a top buffer region, arranged between the front metallization region and the semiconductor body; and a conductive wire, electrically connected to the front metallization region. The top buffer region is at least partially sintered.

20 Claims, 14 Drawing Sheets

(52) U.S. Cl.
CPC ............... *H01L 2224/05647* (2013.01); *H01L 2224/0603* (2013.01); *H01L 2224/29111* (2013.01); *H01L 2224/45015* (2013.01); *H01L 2224/45147* (2013.01); *H01L 2224/4847* (2013.01); *H01L 2224/48491* (2013.01); *H01L 2224/48839* (2013.01); *H01L 2224/73265* (2013.01); *H01L 2924/00014* (2013.01); *H01L 2924/13055* (2013.01); *H01L 2924/35* (2013.01); *H01L 2924/3511* (2013.01); *H01L 2924/3512* (2013.01)

(56) References Cited

U.S. PATENT DOCUMENTS

| | | | |
|---|---|---|---|
| 2002/0113302 A1* | 8/2002 | Shinohara | H01L 23/4334 257/678 |
| 2009/0243089 A1 | 10/2009 | Hohlfeld et al. | |
| 2009/0273066 A1 | 11/2009 | Nikitin et al. | |
| 2011/0070695 A1* | 3/2011 | Bayerer | H01L 24/478 438/107 |
| 2011/0075451 A1* | 3/2011 | Bayerer | H01L 24/06 363/37 |
| 2011/0304985 A1 | 12/2011 | Rittner et al. | |
| 2012/0080800 A1 | 4/2012 | Shinohara | |
| 2014/0021620 A1 | 1/2014 | Lee et al. | |
| 2014/0151744 A1 | 6/2014 | Lee et al. | |

OTHER PUBLICATIONS

Loh et al,. "Wire Bond Reliability for Power Electronic Modules—Effect of Bonding Temperature," 8$^{th}$ Int. Conf. on Thermal, Mechanical and Multiphysics Simulation and Experiments in Micro-Electronics and Micro-Systems, EuroSimE, pp. 1-6, 2007.

* cited by examiner

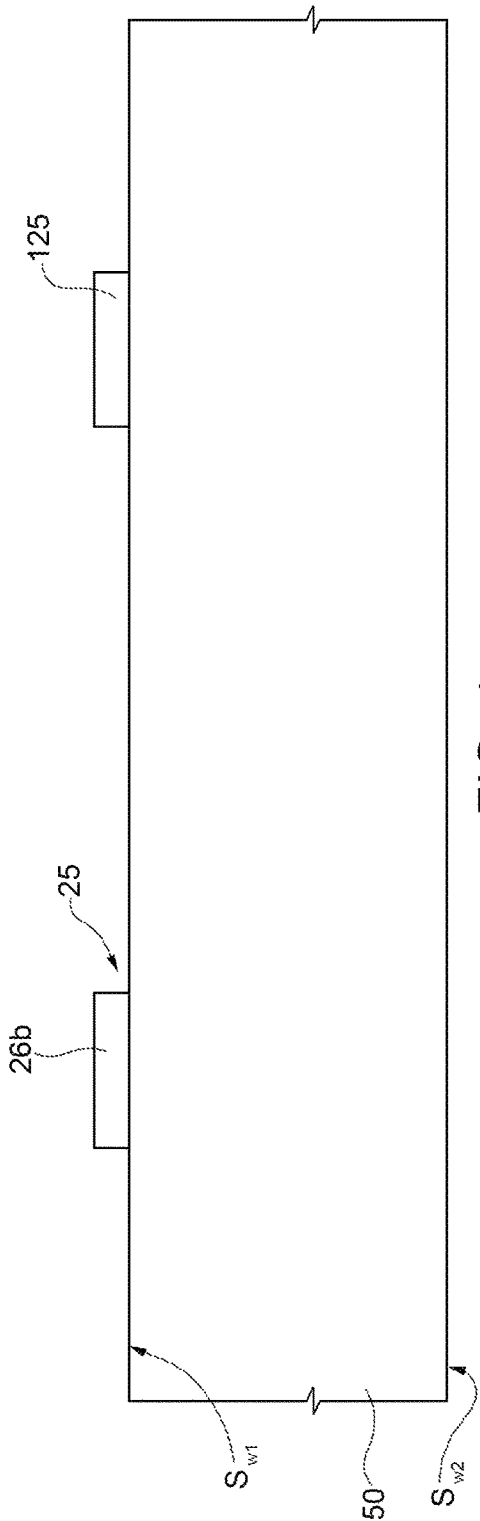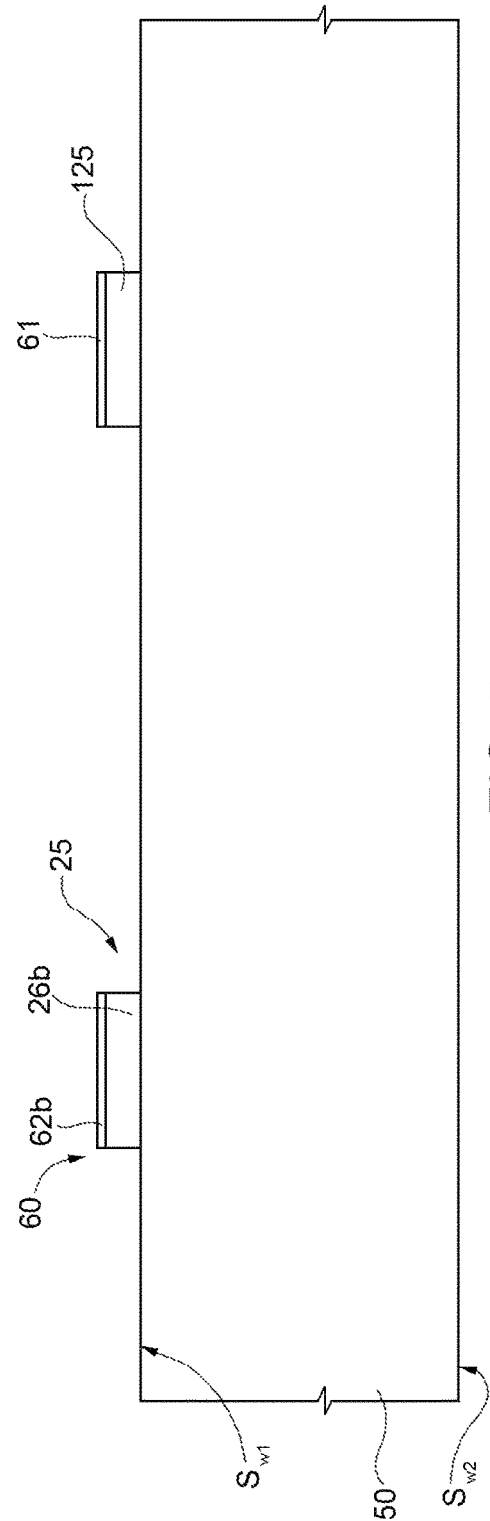

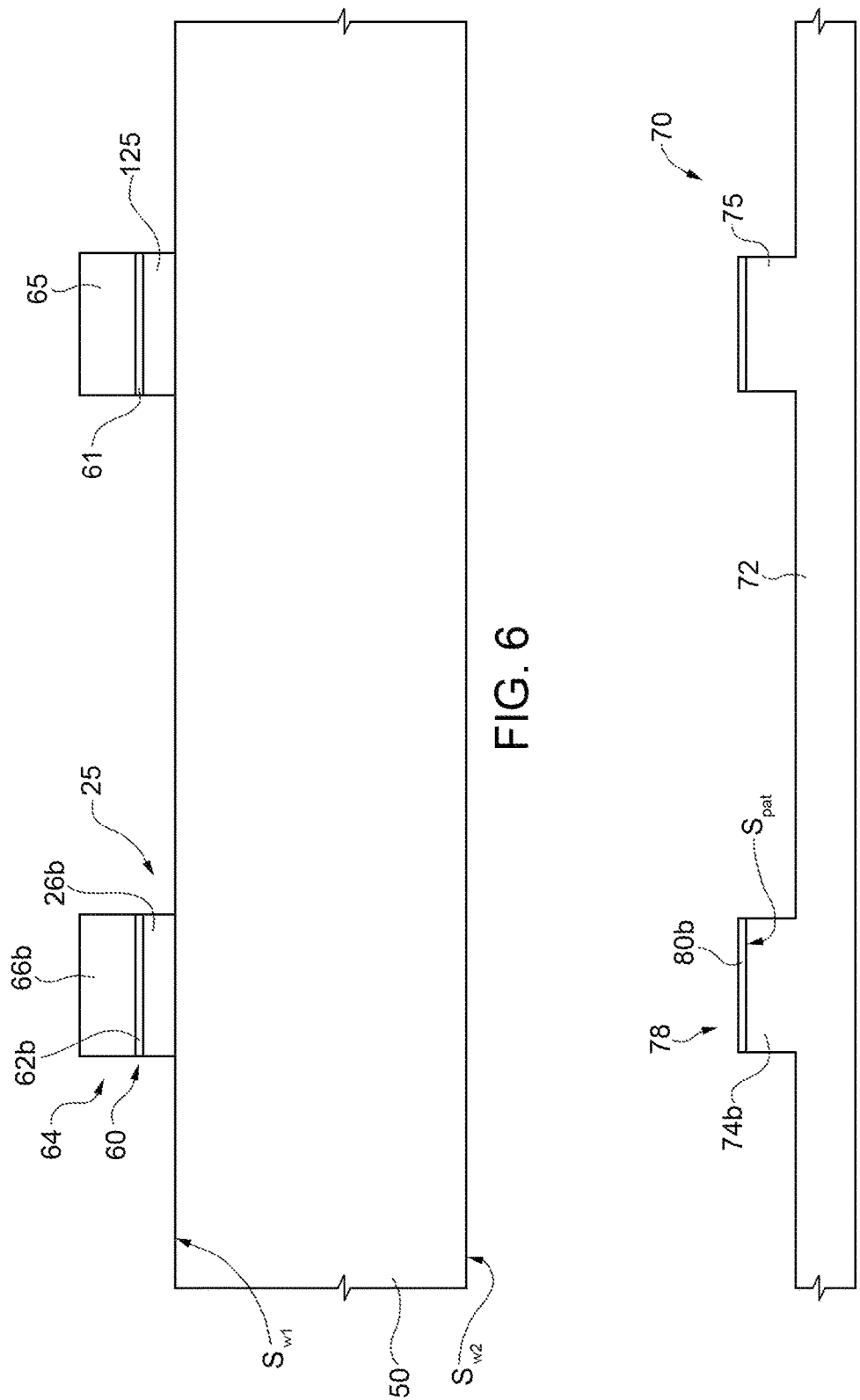

SEMICONDUCTOR DEVICE WITH A WIRE BONDING AND A SINTERED REGION, AND MANUFACTURING PROCESS THEREOF

BACKGROUND

Technical Field

The present disclosure relates to a semiconductor device including a wire bonding and a sintered region.

Description of the Related Art

As is known, today available are numerous electronic power devices, such as for example the so-called "power metal-oxide-semiconductor field-effect transistors" (power MOSFETs), or else "insulated-gate bipolar transistors" (IGBTs).

In the field of electronic power devices, there is particularly felt the need to provide packages that are able to guarantee not only supply of high currents, but also a high reliability.

In general, as shown in FIG. 1, an electronic power device 1 comprises a die 2, which is formed by a semiconductor body 4 and by a front metallization region 6, which extends over the semiconductor body 4. The semiconductor body 4 is made, for example, of silicon or silicon carbide and is arranged above a supporting element 8, to which it is fixed by interposition of a layer 10 known as "die-bonding layer 10".

The electronic power device 1 further comprises a package 14, which in turn comprises, amongst other things, at least one wire 16 of conductive material, which contacts the front metallization region 6 for forming a corresponding wire bonding. The front metallization region 6 and the wire 16 thus form a so-called "chip-to-wire interface".

The reliability of the above chip-to-wire interface is particularly critical and basically depends upon the materials of which the front metallization region 6 and the wire 16 are made.

In greater detail, as described in "Wire Bond Reliability for Power Electronic Modules—Effect of Bonding Temperature", by Wei-Sun Loh et al., 8th International Conference on Thermal, Mechanical and Multiphysics Simulation and Experiments in Micro-Electronics and Micro-Systems, EuroSimE 2007, devices are known in which the front metallization 6 is made of aluminum and has a thickness of 5 µm, and where the wire 16 is also made of aluminum and has a diameter comprised between 100 µm and 500 µm. In this connection, it should be noted how FIG. 1, as on the other hand also the subsequent figures, are not in scale.

Aluminum has a linear coefficient of thermal expansion (linear CTE) of approximately 25 ppm/° K., whereas silicon has a linear coefficient of thermal expansion of approximately 4 ppm/° K. This difference between the values of the coefficients of thermal expansion causes high mechanical stresses at the chip-to-wire interface, when the electronic power device 1 undergoes a succession of thermal cycles. In practice, from the standpoint of reliability, the interface between the wire 16 and the front metallization region 6 represents the weak point of the electronic power device 1, in which both shear stresses and flexural stresses are concentrated. These stresses may cause failure of the interface, in which case the front metallization region 6 and the wire 16 become electrically separate, with consequent impossibility of conveying current outside the electronic power device 1, through the wire 16.

In order to improve the reliability of the interface between the front metallization region 6 and the wire 16, there has been proposed the solution of making both the front metallization region 6 and the wire 16 of copper, as described, for example, in "Large Cu Wire Wedge Bonding Process for Power Devices", by J. Ling et al., 13th Electronics Packaging Technology Conference, 2011.

Copper is harder than aluminum and has a linear coefficient of thermal expansion of approximately 17 ppm/° K. In addition, copper exhibits a greater current-carrying capacity as compared to aluminum and enables formation of interconnections of smaller size given the same current.

When the front metallization region 6 is made of copper, it may have a large thickness, in such a way as to limit substantially the possibility of the front metallization region 6 itself being subject to phenomena of damage such as cratering. On the other hand, the large thickness of the front metallization region 6 may entail, during the process of manufacture of the electronic power device 1, a warpage of the semiconductor wafer.

BRIEF SUMMARY

One embodiment of the present disclosure is a semiconductor device that overcomes at least in part the drawbacks of the known art.

According to the present disclosure, a semiconductor device and a manufacturing process are provided, as defined in claims 1 and 9, respectively.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIG. 3b shows a more detailed perspective view of the structure shown in FIG. 3a;

FIGS. 4-6 and 8-10 are schematic cross-sectional views of portions of an embodiment of the present semiconductor device, during steps of the manufacturing process;

FIG. 7a is a schematic cross-sectional view of a portion of a structure used during the manufacturing process of an embodiment of the present semiconductor device;

FIG. 7b is a perspective view with portions removed of the portion of structure shown in FIG. 7a;

FIG. 11b is a more detailed cross-sectional view of a structure shown in FIG. 11a;

DETAILED DESCRIPTION

Figure 1:
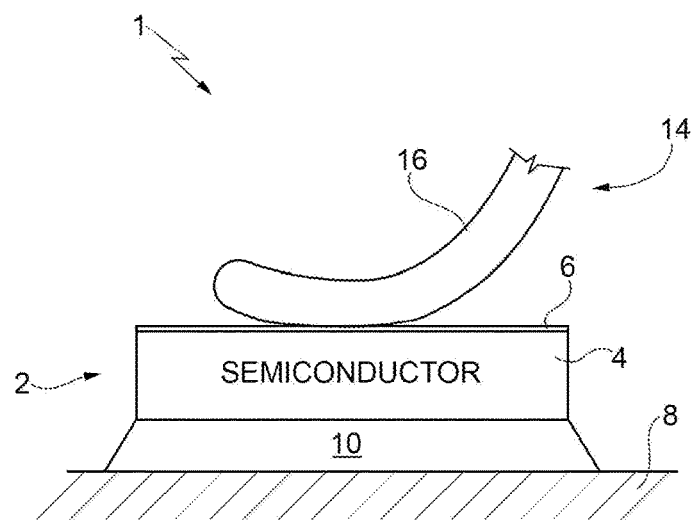
FIG. 1 is a schematic cross-sectional view of a portion of an electronic device of a known type.
Figure 2:
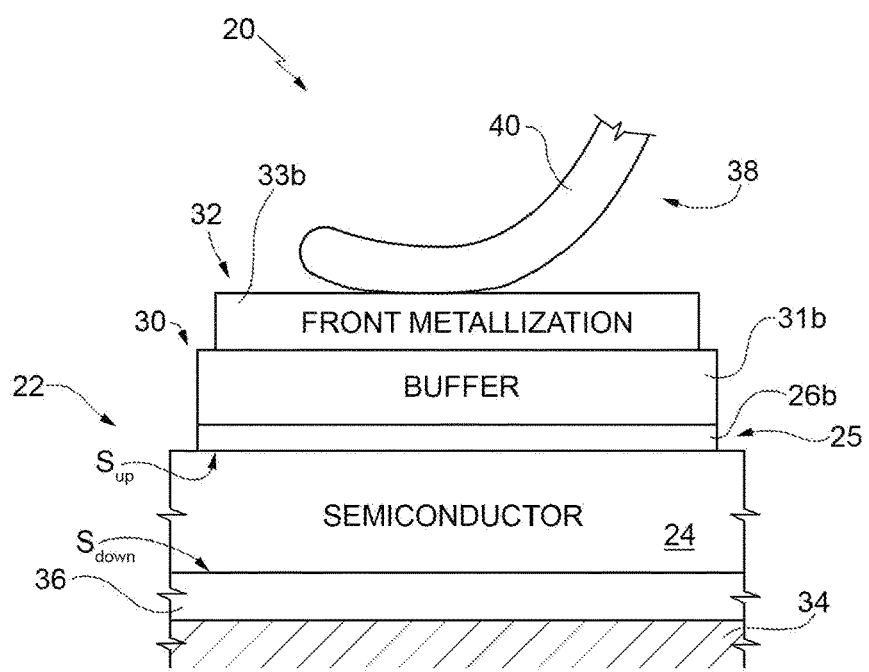
FIG. 2 is a schematic cross-sectional view of a portion of an embodiment of the present semiconductor device.

FIG. 2 shows a semiconductor device 20. As mentioned previously, FIG. 2 and the subsequent figures are not in scale. Without this implying any loss of generality, in the present description it is assumed that the semiconductor device 20 is a power MOSFET, even though it may likewise be, once again purely by way of example, an IGBT. On the other hand, it is likewise possible for the semiconductor device 20 to be a device for low-power applications.

In detail, the semiconductor device 20 comprises a die 22, which is formed by a semiconductor body 24 and a top structure 25, which is electrically conductive and is arranged above the semiconductor body 24, with which it is in direct contact.

Without this implying any loss of generality, in what follows it is assumed that the semiconductor body 24 is made of silicon. In greater detail, the semiconductor body 24 is delimited at the top and at the bottom by a top surface $S_{up}$ and a bottom surface $S_{down}$, respectively. The top structure 25 extends over the top surface $S_{up}$, with which it is in direct contact.

In a per se known manner, the top structure 25 defines the so-called "die-front layout". More in particular, as shown in FIG. 3, the top structure 25 comprises a first top region 26a, a second top region 26b, and a third top region 26c, which are physically separate from one another and coplanar. Without this implying any loss of generality, in the embodiment shown in FIG. 3, the first, second, and third top regions 26a-26c have the same thickness, ranging, for example, between 3.4 μm and 10.5 μm; further, the first and third top regions 26a, 26c have to a first approximation an "H" shape, in top plan view, whereas the second top region 26b is arranged between them and has a rectangular shape.

Even though it is not shown, the top structure 25 may be formed by a multilayer structure of a per se known type, which in turn may include, for example: an aluminum-silicide (AlSi) layer, which is arranged in contact with the semiconductor body 24 and has a thickness ranging, for example, between 3 μm and 10 μm; a titanium layer, which overlies the aluminum-silicide layer, with which it is in direct contact, and has a thickness ranging, for example, between 0.15 μm and 0.2 μm; and a nickel or nickel-alloy layer, which overlies the titanium layer, with which it is in direct contact, and has a thickness ranging, for example, between 0.25 μm and 0.3 μm.

The semiconductor device 20 further comprises a further structure 30, which will be referred to hereinafter as "top buffer structure 30", as well as a front metallization 32.

As described in greater detail hereinafter, the top buffer structure 30 is made of silver, has a thickness ranging, for example, between 30 μm and 50 μm and extends over the top structure 25, with which it is in direct contact.

Figure 3A:
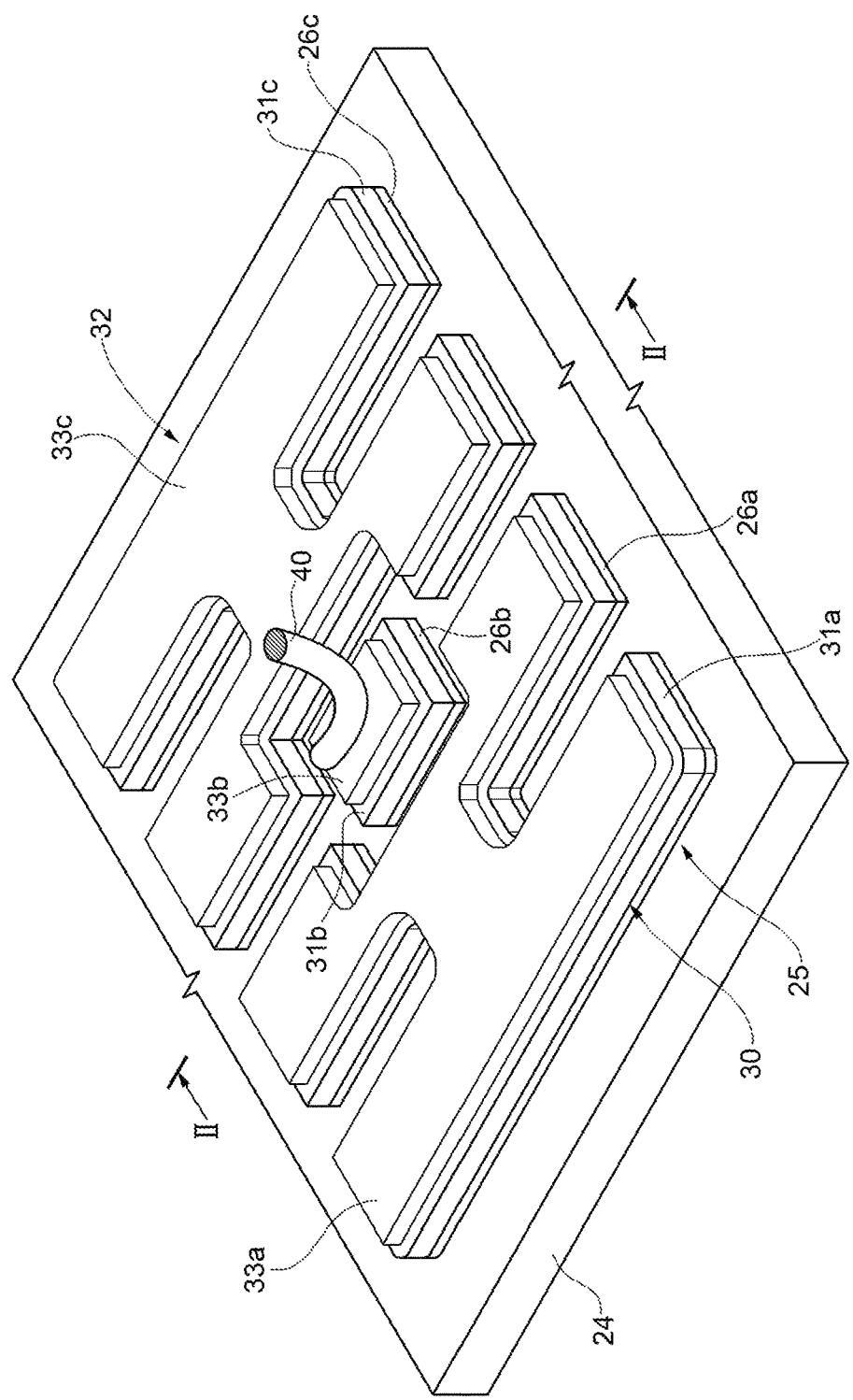
FIG. 3a is a perspective view of a portion of an embodiment of the present semiconductor device.

More in particular, as shown in FIG. 3a, the top buffer structure 30 includes a first top buffer region 31a, a second top buffer region 31b, and a third top buffer region 31c, which are physically separate from one another and are coplanar. In greater detail, the first, second, and third top buffer regions 31a-31c are arranged, respectively, in contact with the first, second, and third top regions 26a-26c. Further, without this implying any loss of generality, the first, second, and third top buffer regions 31a-31c have, respectively, the same shapes, in top plan view, as the first, second, and third top regions 26a-26c, with which they are respectively vertically aligned.

Even more particularly, even though not shown in FIGS. 2 and 3a, the top buffer structure 30 comprises a respective bottom portion, which contacts the top structure 25, and a respective intermediate portion, which is arranged above the bottom portion, with which it is in direct contact. Further, the top buffer structure 30 comprises a top portion, which is arranged above the intermediate portion, with which it is in direct contact. The top portion, the intermediate portion, and the bottom portion of the top buffer structure 30 are substantially layered and have to a first approximation the same shape in top plan view. Further, the intermediate portion of the top buffer structure 30 is made of sintered silver, whereas the bottom portion and the top portion are made of non-sintered silver. The sintered silver has a porosity comprised, for example, between 5% and 15%.

Figure 3B:
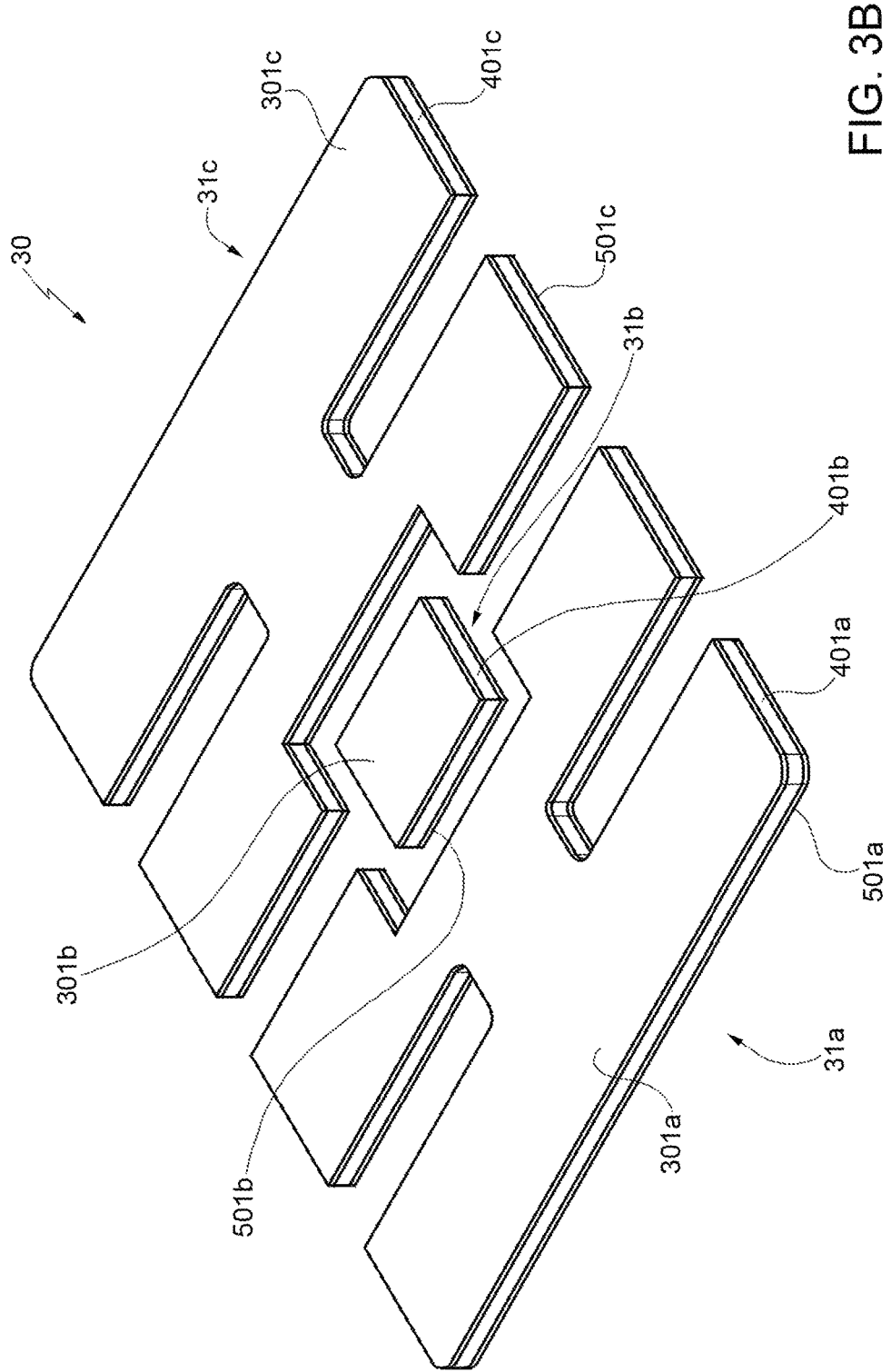

More precisely, each of the first, second, and third top buffer regions 31a-31c comprises a respective bottom portion, a respective intermediate portion, and a respective top portion, as shown just in FIG. 3b, where the top portions of the first, second, and third top buffer regions 31a-31c are designated, respectively, by 301a-301c; the underlying intermediate portions are designated, respectively, by 401c-401c, whereas the corresponding bottom portions are designated, respectively, by 501a-501c.

Each of the top portions 301a-301c of the first, second, and third top buffer regions 31a-31c has a thickness ranging, for example, between 3 μm and 8 μm. Further, each of the intermediate portions 401a-401c of the first, second, and third top buffer regions 31a-31c has a thickness ranging, for example, between 27 μm and 42 μm, whereas each of the bottom portions 501a-501c of the first, second, and third top buffer regions 31a-31c has a thickness ranging, for example, between 0.1 μm and 0.2 μm. Further, the bottom portions 501a-501c of the first, second, and third top buffer regions 31a-31c contact the first, second, and third top regions 26a-26c, respectively.

In what follows, except where otherwise specified, reference to the bottom portion, to the intermediate portion, and to the top portion of the top buffer structure 30, and thus also of each of the first, second, and third top buffer regions 31a-31c, is omitted, for simplicity, and these are referred to as a whole as "top buffer structure 30" and/or "first, second, and third top buffer regions 31a-31c".

The front metallization 32 is made, for example, of copper, has a thickness ranging, for example, between 35 μm and 65 μm, and extends over the top buffer structure 30, with which it is in direct contact.

More in particular, as shown in FIG. 3a, the front metallization 32 comprises a first front metallization region 33a, a second front metallization region 33b, and a third front metallization region 33c, which are physically separate from one another and coplanar. In detail, the first, second, and third front metallization regions 33a-33c are arranged, respectively, in contact with the first, second, and third top buffer regions 31a-31c, and in particular with the respective top portions 301a-301c. Without this implying any loss of generality, basically the first, second, and third front metallization regions 33a-33c are aligned vertically with the first, second, and third top buffer regions 31a-31c, respectively. In addition, once again without this implying any loss of generality, the first, second, and third front metallization regions 33a-33c have, respectively, the same shapes, in top plan view, as the first, second, and third top buffer regions 31a-31c, but for a scale factor such that the first, second, and third front metallization regions 33a-33c do not cover entirely the first, second, and third top buffer regions 31a-31c, which thus remain partially exposed.

In practice, the first, second, and third front metallization regions 33a-33c are electrically separate from one another and form, respectively, a source metallization, a gate metallization, and a drain metallization.

Once again with reference to FIG. 2, the semiconductor device 20 further comprises a supporting element 34 made, for example, of copper, and a die-bonding layer 36 made, for example, of a tin-based metal alloy. In a per se known manner, the semiconductor body 24 is fixed to the supporting element 34 by interposition of the die-bonding layer 36.

The semiconductor device 20 further comprises a package 38 (shown only in part), which in turn comprises at least one wire 40, which is made, for example, of copper and has a diameter ranging, for example, between 100 μm and 500 μm. Without this implying any loss of generality, the wire 40 contacts the second front metallization region 33b for forming a corresponding wire bonding of a per se known type. The package 38 may further comprise a further pair of wires (not shown), which contact, respectively, the first and third front metallization regions 33a, 33c for forming corresponding wire bondings. In a per se known manner, the package 38 may likewise comprise a coating region (not shown) formed by a so-called "molding compound".

In practice, the wire 40 and the front metallization 32, and in particular the second front metallization region 33b, form a so-called "chip-to-wire interface". Further, the front metallization 32 of the semiconductor device 20 has a small thickness, but sufficient to render the front metallization 32 itself less subject to phenomena of damage induced by the presence of the overlying wire bondings, thanks to the presence of the underlying top buffer structure 30, which is at least partially sintered. In addition, the semiconductor device 20 may be manufactured by a process such as to reduce warpage of the semiconductor wafer, as described in what follows.

As shown in FIG. 4, the present manufacturing process envisages providing, in a per se known manner, a semiconductor wafer 50, delimited at the top and at the bottom by a first wafer surface $S_{w1}$ and a second wafer surface $S_{w2}$, respectively.

Extending over the first wafer surface $S_{w1}$ is a plurality of top structures. In this connection, without this implying any loss of generality, in the present description the term "top plan view", as on the other hand also the adjectives "top" and "bottom" and the adverbs of place "above" and "below" and the like, refer to a direction perpendicular to the main surfaces of the die/wafer and to an orientation from the semiconductor region towards the front metallization (equivalently, towards the top structure).

In particular, extending on the first wafer surface $S_{w1}$ is the aforementioned top structure 25 (in FIG. 4 just the second top region 26b is visible) and a further top structure 125, which is to form a semiconductor device distinct from the semiconductor device 20, and which will be referred to hereinafter as "additional top structure 125". In this connection, the presence of the additional top structure 125 does not entail any loss of generality, in the sense that it could be absent, or else there could be present a number of additional top structures. In what follows, it will be assumed that, in addition to the top structure 25, just the additional top structure 125 is present. Furthermore, once again without this implying any loss of generality, it will be assumed that the additional top structure 125 has the same shape as the top structure 25, with respect to which it is laterally staggered. In addition, in what follows the manufacturing process is described with reference to the operations that involve the top structure 25, and in particular the second top region 26b, except where otherwise specified.

As shown in FIG. 5, formed in succession above the top structure 25 and above the additional top structure 125 are, for example, using a masking and sputtering process, a first region 60 and a second region 61, which will be referred to hereinafter as "first and second process regions 60, 61".

The first and second process regions 60, 61 are made of silver. In addition, to a first approximation, in top plan view the first and second process regions 60, 61 have respectively the same geometrical shape as the top structure 25 and the additional top structure 125, with respect to which they are vertically aligned. In addition, both the first process region 60 and the second process region 61 have a thickness ranging, for example, between 0.1 μm and 0.2 μm.

In particular, the first process region 60 extends over the first, second, and third top regions 26a-26c. Further, the first process region 60 comprises a layer 62b, which will be referred to hereinafter as "first process layer 62b". The first process layer 62b extends over the second top region 26b, with which it is in direct contact, and has a thickness that is the same as the aforementioned thickness of the first and second process regions 60, 61. Further, the first process layer 62b is patterned for presenting substantially, in top plan view, the same geometrical shape as the second top region 26b.

As shown in FIG. 6, formed in succession above the first and second process regions 60, 61 are, respectively, a third region 64 and a fourth region 65, which will be referred to hereinafter as "third and fourth process regions 64, 65". In particular, the third and fourth process regions 64, 65 are obtained, for example, by silk-screen printing, in a per se known manner. Further, each of the third and fourth process regions 64, 65 is made of a sintering paste of a known type, including a plurality of silver microparticles and/or nanoparticles dispersed in a solvent. For example, said particles may have diameters ranging between 30 nm and 5 μm.

In top plan view, to a first approximation, the third and fourth process regions 64, 65 have the same shape, respectively, as the first and second process regions 60, 61, with respect to which they are vertically aligned. Further, the third and fourth process regions 64, 65 have a thickness ranging, for example, between 30 μm and 100 μm.

In particular, the third process region 64 extends over the first process region 60, and thus also over the first, second, and third top regions 26a-26c. Further, the third process region 64 comprises a layer 66b, which will be referred to hereinafter as "second process layer 66b". The second process layer 66b extends over the first process layer 62b, with which it is in direct contact, and has a thickness that is the same as the aforementioned thickness of the third and fourth process regions 64, 65. Further, in top plan view, the second process layer 66b may have approximately the same geometrical shape as the first process layer 62b.

In a per se known manner, the third and fourth process regions 64, 65 may further undergo, after they have been formed above the first and second process regions 60, 61, a pre-drying process of a known type in order to cause evaporation of at least part of the solvent. For example, the pre-drying process may be carried out at a temperature of approximately 100° C., and with a duration of 15 minutes. Albeit not shown in the figures, the pre-drying process may entail a reduction in the thickness of the third and fourth process regions 64, 65, even around 50%.

Next, a patterned structure 70 (shown in FIGS. 7a and 7b) is provided, made of copper.

Figure 7B:
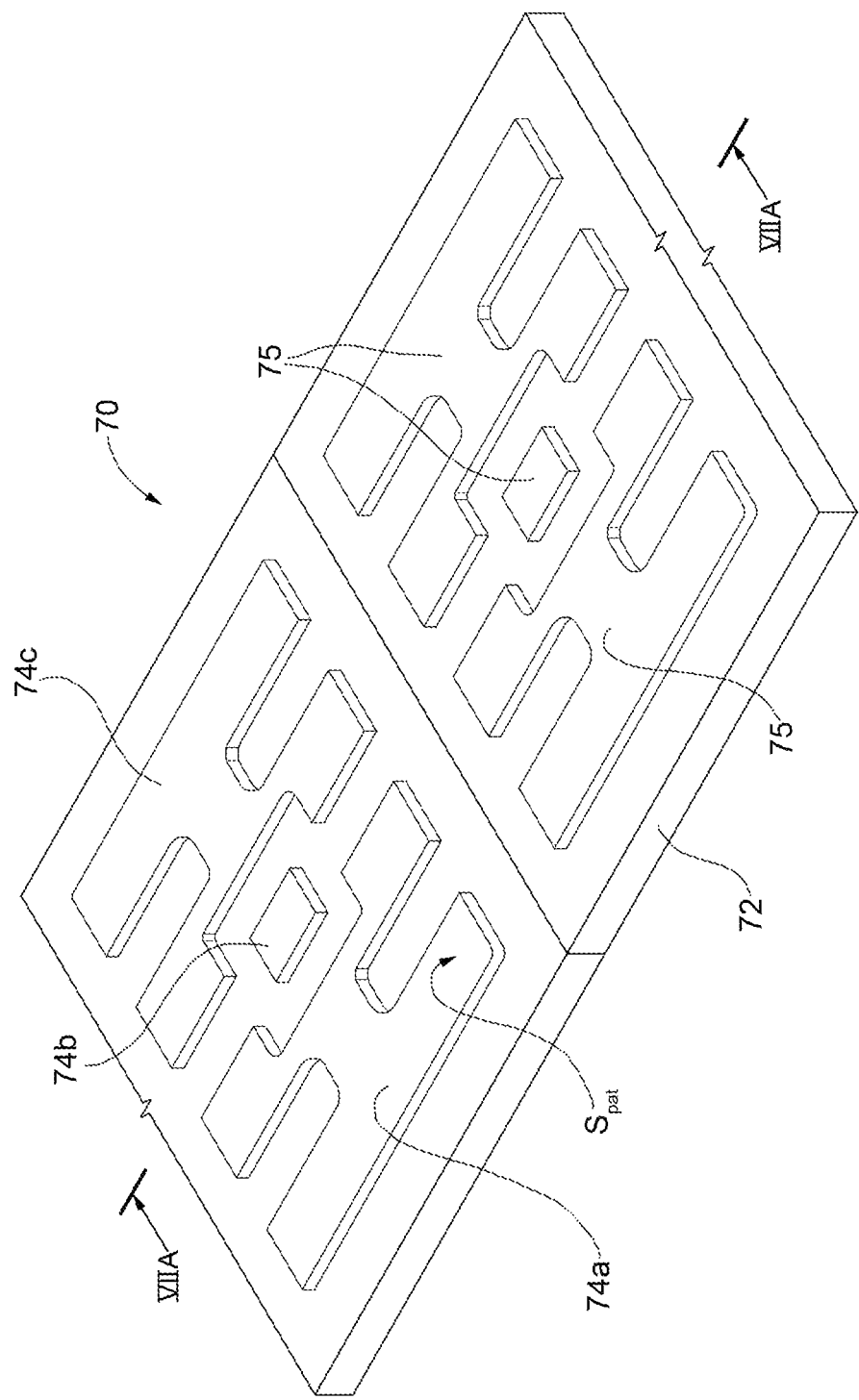

The patterned structure 70 comprises a main body 72, having a planar shape, and a plurality of cantilever portions, which extend, starting from the main body 72, in a direction perpendicular with respect to the latter. In particular, as shown in FIG. 7b, the aforementioned plurality of cantilever portions includes a first cantilever portion, a second cantilever portion, and a third cantilever portion, which are designated respectively by 74a, 74b, 74c, the remaining cantilever portions, i.e., the cantilever portions other than the first, second, and third cantilever portions 74a-74c being designated as a whole by 75.

In greater detail, the main body 72 may have a thickness (measured in a direction perpendicular to the main body 72) ranging, for example, between 150 μm and 200 μm. Further, the first, second, and third cantilever portions 74a-74c and the remaining cantilever portions 75 have a thickness ranging, for example, between 150 μm and 200 μm. In addition, each cantilever element has a first end and a second end, the second end being connected to the main body 72, the first end being delimited by a corresponding surface, which is parallel to the main body 72. Said surfaces that delimit the first ends of the cantilever elements form as a whole a surface $S_{pat}$, which will be referred to hereinafter as "patterned surface $S_{pat}$".

The patterned structure 70 may have been previously formed, for example, by selective removal of portions of a copper plate (not shown). Further, the patterned structure 70 is partially coated with a further silver region 78 (not shown in FIG. 7b, for reasons of simplicity of representation), which will be referred to hereinafter as "fifth process region 78". In particular, the fifth process region 78 has a thickness ranging, for example, between 3 μm and 8 μm and extends over the patterned surface $S_{pat}$, and thus extends in contact with the first ends of the aforementioned first, second, and third cantilever portions 74a-74c. Even more in particular, the fifth process region 78 may be obtained by electrolytic plating and comprises a layer 80b, which will be referred to hereinafter as "third process layer 80b", which extends in contact with the second cantilever portion 74b and has a thickness that is the same as the aforementioned thickness of the fifth process region 78.

Figure 8:
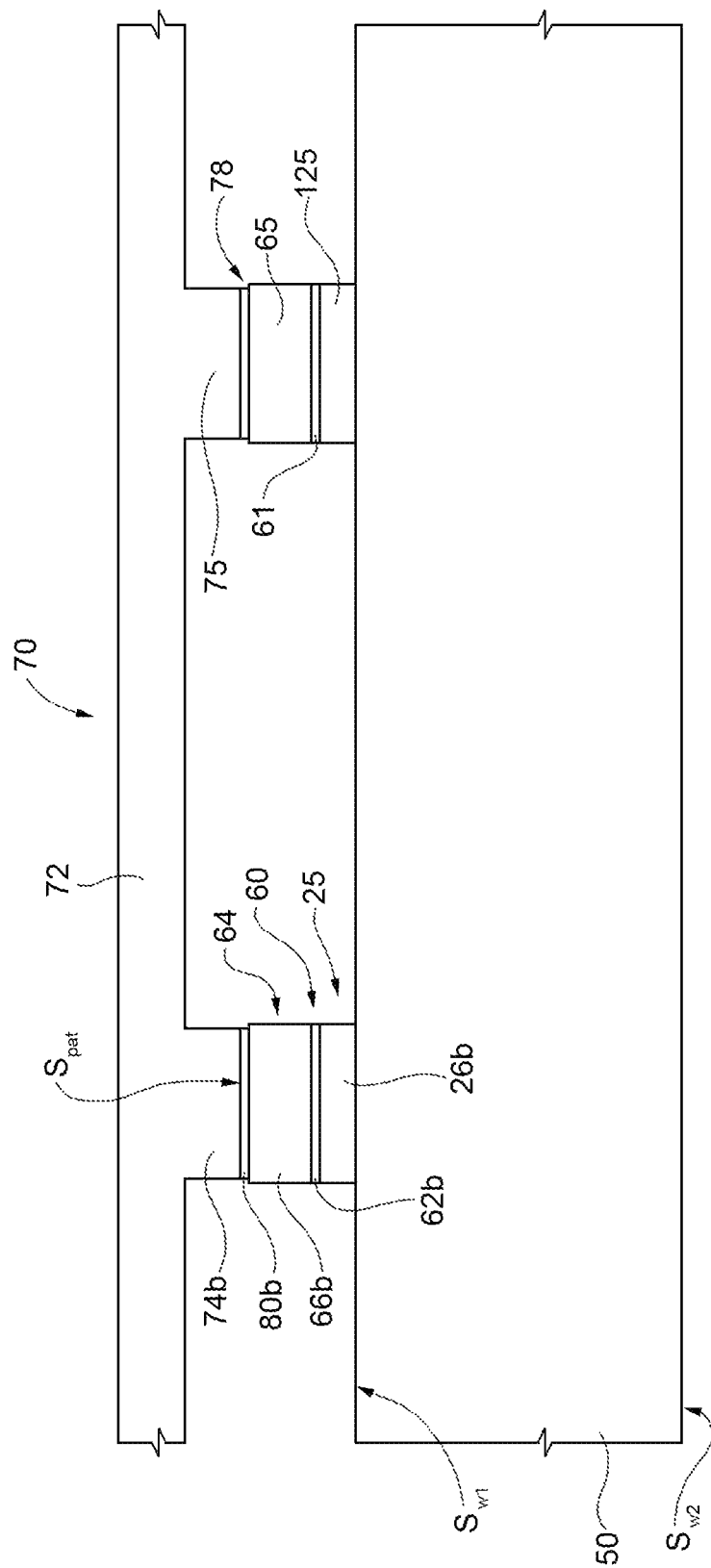

This being said, as shown in FIG. 8, the patterned structure 70 is then mechanically coupled to the semiconductor wafer 50. For this purpose, the patterned structure 70 is arranged in such a way that the fifth process region 78 faces the semiconductor wafer 50, and in particular contacts the third and fourth process regions 64, 65. In greater detail, the first, second, and third cantilever portions 74a-74c overly, respectively, the first, second, and third top regions 26a-26c, at a distance therefrom (in FIG. 8 just the second top region 26b is visible). Further, the third process layer 80b contacts the second process layer 66b.

Figure 9:
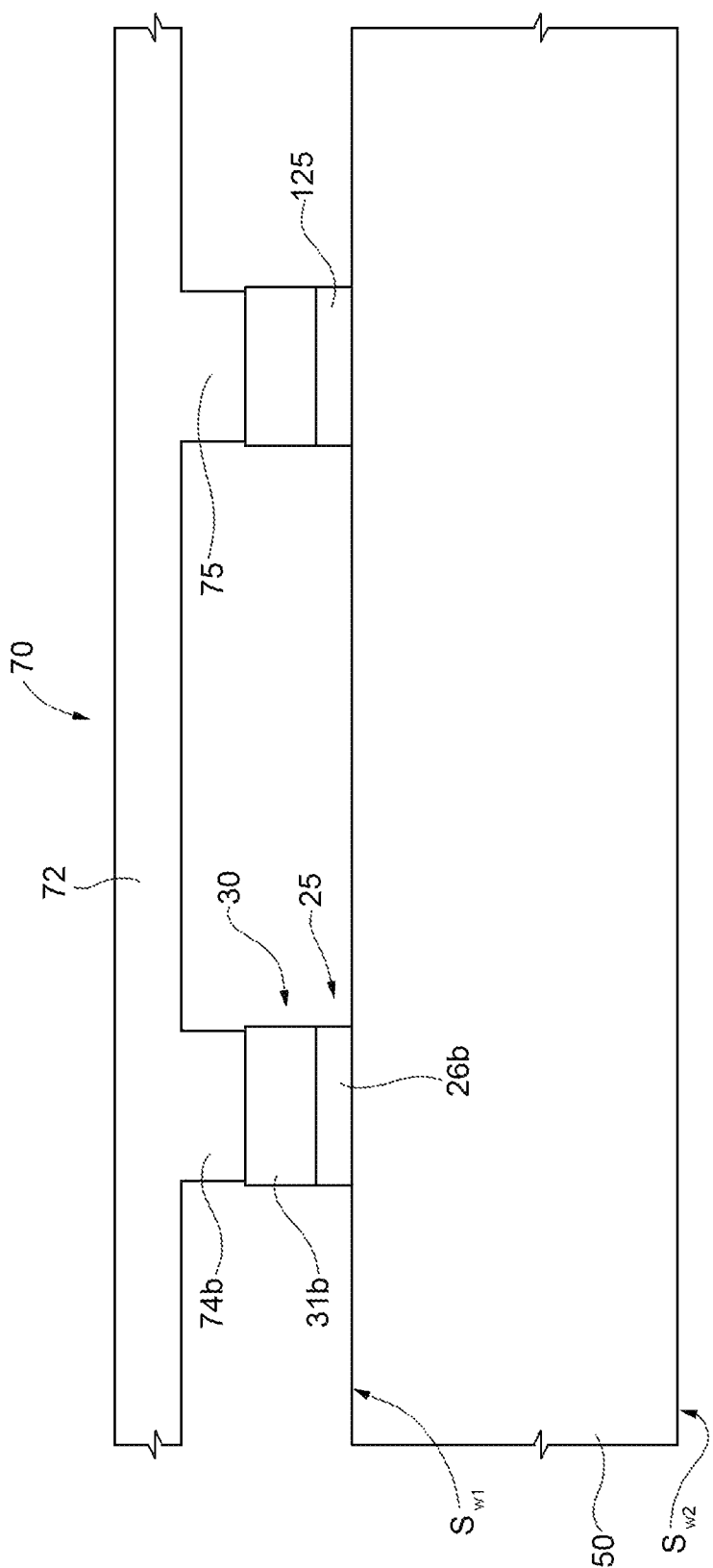

Next, as shown in FIG. 9, a thermal treatment is carried out, in such a way that the first process region 60, the third process region 64, and the portion of fifth process region 78 in contact with the third process region 64 form the top buffer structure 30, and thus the first, second, and third top buffer regions 31a-31c (in FIG. 9 just the second top buffer region 31b is visible), following upon a process of sintering of the third process region 64. In practice, the first, second, and third top buffer regions 31a-31c are arranged, respectively, between: i) the first cantilever portion 74a and the first top region 26a; ii) the second cantilever portion 74b and the second top region 26b; and iii) the third cantilever portion 74c and the third top region 26c.

In particular, the second top buffer region 31b, and even more in particular the intermediate portion 401b of the second top buffer region 31b, is obtained by sintering of the second process layer 66b. To a first approximation, the first and third process layers 62b, 80b, and more in general the first, second, and fifth process regions 60, 61, 78, are not sintered, except for the atomic layers closest to the sintering paste. Consequently, in the sequel of the present description their partial sintering is disregarded. The first and third process layers 62b, 80b thus form, respectively, the top portion 301b and the bottom portion 501b of the second top buffer region 31b.

In greater detail, the aforementioned thermal treatment may comprise, for example, a thermal cycle that envisages raising the temperature from room temperature up to approximately 230° C., exerting simultaneously a pressure ranging, for example, between 10 MPa and 30 MPa between the patterned structure 70 and the second wafer surface $S_{w2}$, and a subsequent cooling to room temperature; this cooling may be obtained using liquid.

Figure 10:
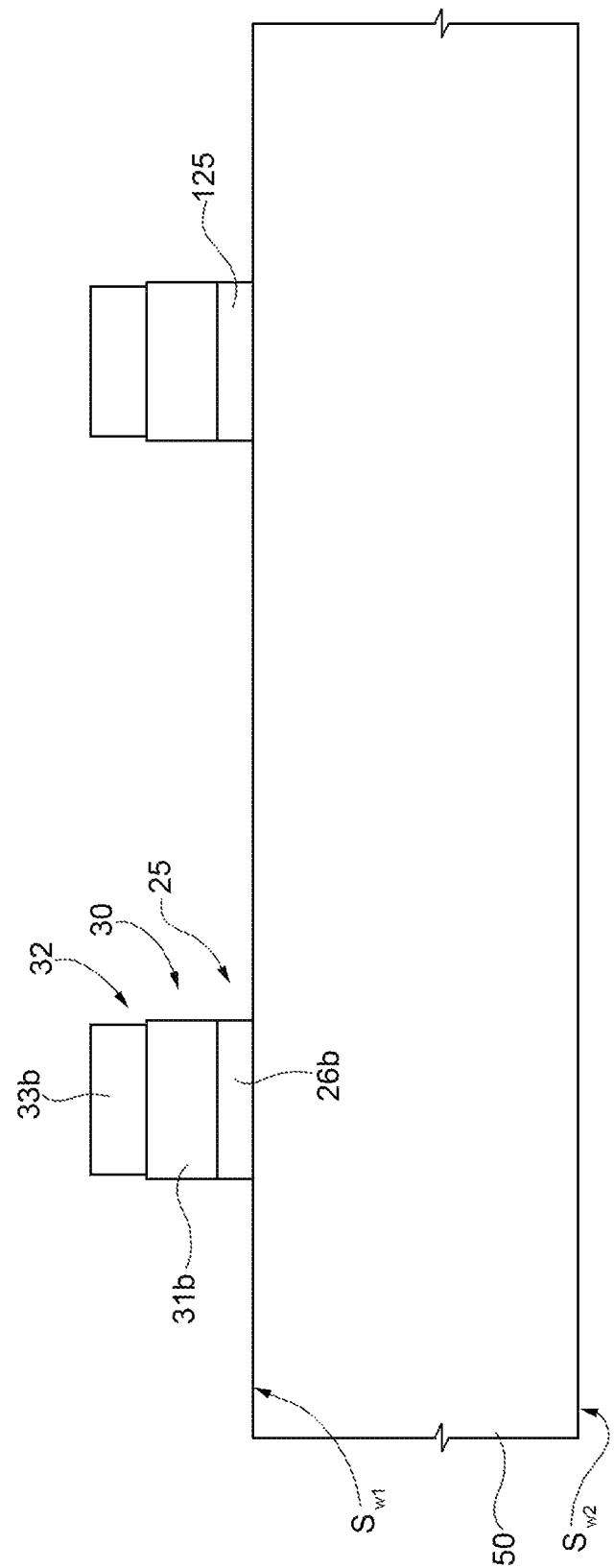

Next, as shown in FIG. 10, a process of grinding of the patterned structure 70 is carried out in order to remove the main body 72 and parts of the first, second, and third cantilever portions 74a-74c, as well as of the remaining cantilever portions 75. In this way, the front metallization 32 is formed. In particular, the remaining parts of the first, second, and third cantilever portions 74a-74c form, respectively, the first, second, and third front metallization regions 33a-33c (in FIG. 10 just the second front metallization region 33b is visible), which, as explained previously, are physically separate from one another.

The manufacturing process is then completed in a per se known manner, by carrying out final operations, which comprise, amongst other things, dicing using the so-called "dicing saw", and formation of the package 38, the latter operation further comprising formation of the wire bondings.

From what has been described and illustrated previously, the advantages that the present solution affords are evident.

In particular, by fixing a front metallization to the semiconductor body using a sintered region, it is possible to reduce the thickness of the front metallization for optimizing the corresponding manufacturing process, without jeopardizing the strength of the chip-to-wire interface. In greater detail, the use of the sintered region enables formation of wire bondings without damage to the front metallization or warping of the semiconductor wafer during the manufacturing process.

Finally, it is clear that modifications and variations may be made to what has been described and illustrated herein, without thereby departing from the scope of the present disclosure.

Figure 11A:
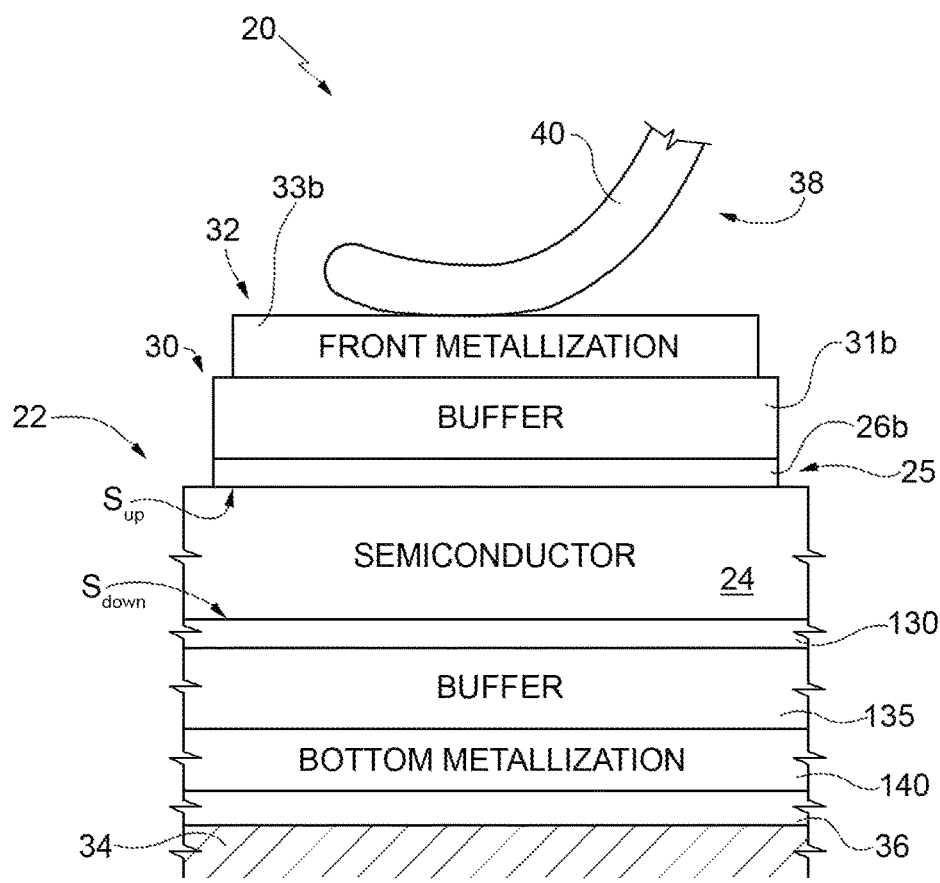
FIG. 11a is a schematic cross-sectional view of a portion of an embodiment of the present semiconductor device.

For example, as shown in FIG. 11a, the semiconductor device 20 may comprise a bottom structure 130, arranged underneath the bottom surface $S_{down}$ of the semiconductor body 24, with which it is in direct contact. The bottom structure 130 is electrically conductive and may be formed, for example, by an aluminum-silicide (AlSi) layer, by a titanium layer, and by a nickel or nickel-alloy layer (not shown). The bottom structure 130 may thus be the same as the top structure 25. In general, the bottom structure 130 may have a thickness ranging, for example, between 3.4 μm and 10.5 μm.

Extending underneath the bottom structure 130, and in direct contact with the latter, is a further buffer structure 135 of silver, which will be referred to hereinafter as "bottom buffer structure 135". The bottom buffer structure 135 may have the same thickness as the top buffer structure 30. In general, the bottom buffer structure 135 may have a thickness ranging, for example, between 30 μm and 50 μm.

Figure 11B:
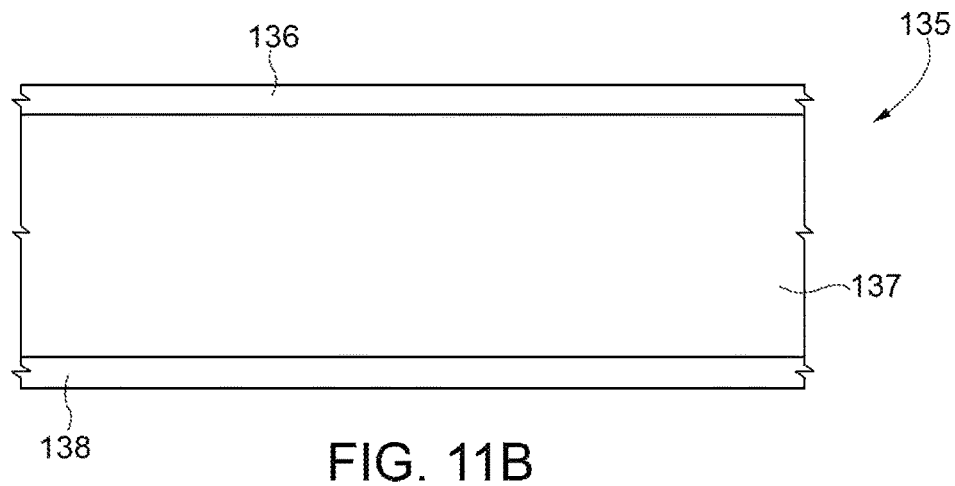

More in particular, as shown in FIG. 11b, the bottom buffer structure 135 comprises a respective top portion 136, which contacts the bottom structure 130, and a respective intermediate portion 137, which extends underneath the top portion 136, with which it is in direct contact. Further, the bottom buffer structure 135 comprises a respective bottom portion 138, which is arranged underneath the intermediate portion 137, with which it is in direct contact.

The top portion 136, the intermediate portion 137, and the bottom portion 138 of the bottom buffer structure 135 are substantially layered, and the respective thicknesses may for example be the same as the thicknesses of the bottom portion, of the intermediate portion, and of the top portion, respectively, of the top buffer structure 30. In general, the thicknesses of the top portion 136, of the intermediate portion 137, and of the bottom portion 138 of the bottom buffer structure 135 may range, respectively, between 0.1 µm and 0.2 µm, 27 µm and 42 µm, and 3 µm and 8 µm. Further, the intermediate portion 137 of the bottom buffer structure 135 is made of sintered silver, whereas the bottom portion 138 and the top portion 136 are made of non-sintered silver.

In what follows, except where otherwise specified, reference to the bottom portion 138, the intermediate portion 137, and the top portion 136 of the bottom buffer structure 135 is omitted, and these will be referred to as a whole as "bottom buffer structure 135".

The semiconductor device further comprises a bottom metallization 140, which extends underneath the bottom buffer structure 135, with which it is in direct contact. The bottom metallization 140 is made, for instance, of copper and has a thickness that is, for example, the same as that of the front metallization 32. In general, the thickness of the bottom metallization 140 may range, for example, between 35 µm and 65 µm.

The presence of the bottom metallization 140 enables further reduction of the possibility of onset of warping phenomena.

Irrespective of the presence of the aforementioned bottom structure 130, bottom buffer structure 135, and bottom metallization 140, the top structure 25 may be of a different type from what has been described. For example, the top structure 25 may include a different number of portions, which in turn may have shapes different from the ones described previously.

It is further possible for the top buffer structure 30 to be made of a conductive material other than silver (for example, gold). In this case, this material forms the first, second, third, fourth, and fifth process regions 60, 61, 64, 65, 78.

As regards each between the front metallization 32 and the bottom metallization 140 (if present), this may be made of a material other than copper. On the other hand, also the wire 40 may be made of a material other than copper. In particular, embodiments are possible in which the front metallization 32 is made of a material different from the material of which the wire 40 is made, but having a linear coefficient of thermal expansion $CTE_{32}$ equal to $CTE_{40} \pm 10\%$, where $CTE_{40}$ is the linear coefficient of thermal expansion of the material that forms the wire 40. Further, in general, the front metallization 32 and the bottom metallization 140 may be made of different materials.

As regards the manufacturing process, it is, for example, possible for removal of the main body 72 to be carried out through a process of chemical etching of the patterned structure 70, instead of a grinding process.

Figure 12:
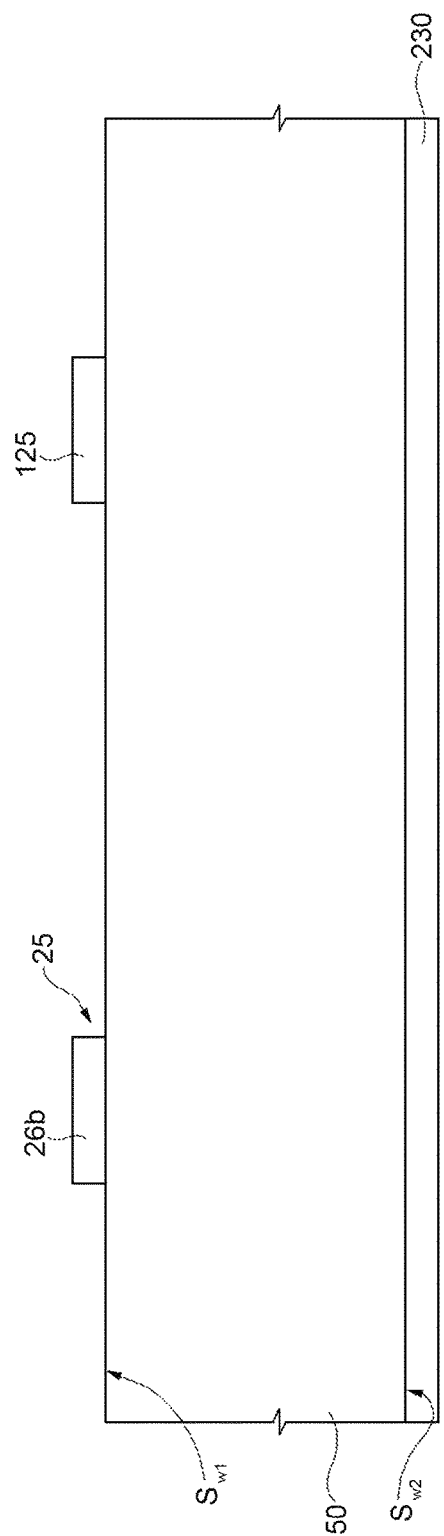
FIGS. 12-14 and 16-17 are schematic cross-sectional views of portions of one embodiment of the present semiconductor device, during steps of the manufacturing process.

Further, in the case where also the bottom buffer structure 135 is present, the manufacturing process envisages formation, underneath the second wafer surface $S_{w2}$, of a structure 230 (shown in FIG. 12) designed to form the bottom structure 130, which will be referred to hereinafter as "bottom plate structure 230".

Figure 13:
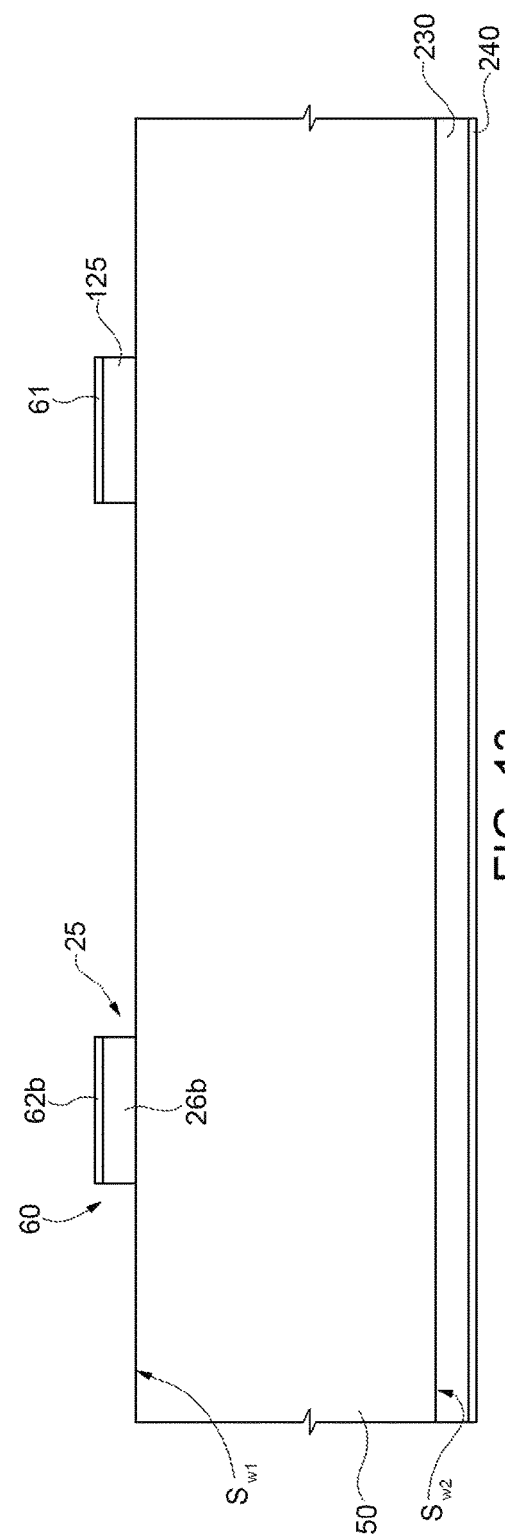

Next, as shown in FIG. 13, formed underneath the bottom plate structure 230 is a layer 240, which will be referred to hereinafter as "fourth process layer 240". The fourth process layer 240 is made of silver. In addition, the fourth process layer 240 may be obtained by sputtering, for example after formation of the first and second process regions 60, 61. The fourth process layer 240 may have a thickness that is, for example, the same as that of the first and second process regions 60, 61, and thus ranging, for example, between 0.1 µm and 0.2 µm.

Figure 14:
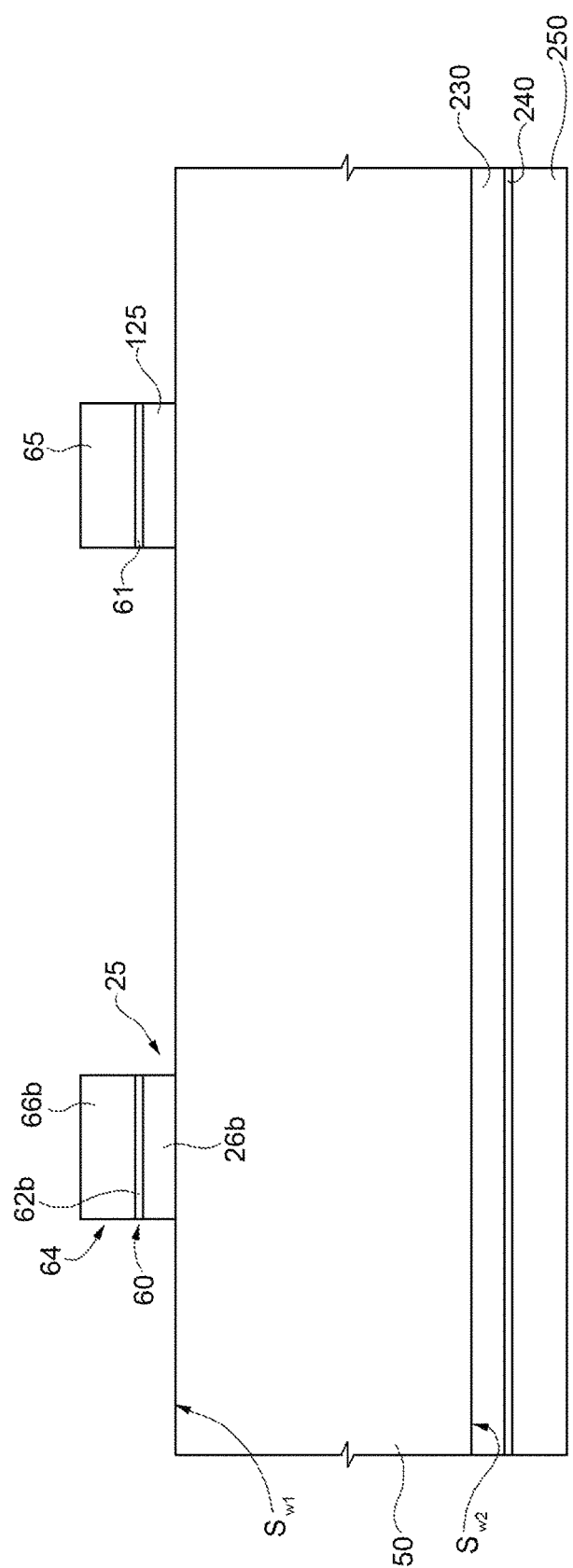

Next, as shown in FIG. 14, underneath the fourth process layer 240 a further layer 250 is formed, which will be referred to hereinafter as "fifth process layer 250". The fifth process layer 250 is obtained, for instance, by silk-screen printing and may be formed, for example, after formation of the third and fourth process regions 64, 65. Further, the fifth process layer 250 is made of a sintering paste of a known type, including a plurality of silver microparticles and/or nanoparticles dispersed in a solvent. For example, these particles may have diameters ranging between 30 nm and 5 µm. In addition, the fifth process layer 250 has a thickness that is, for example, the same as that of the third and fourth process regions 64, 65, and thus ranging, for example, between 30 µm and 100 µm.

Figure 15:
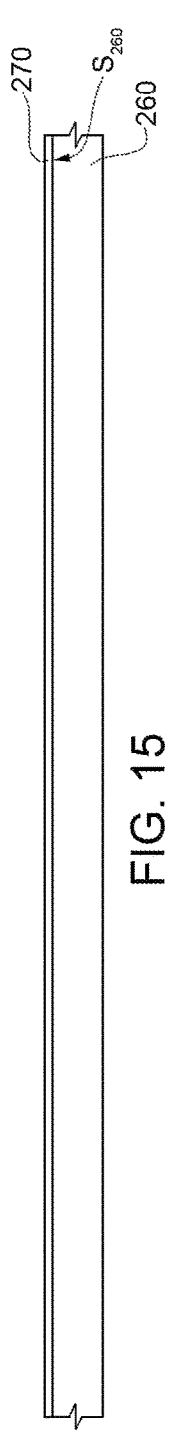
FIG. 15 is a schematic cross-sectional view of a plate used during the manufacturing process of one embodiment of the present semiconductor device.

Next, a plate 260 is provided (shown in FIG. 15), made, for example, of copper and delimited at the top by a surface $S_{260}$, which will be referred to hereinafter as "plate surface $S_{260}$". The plate surface $S_{260}$ is coated by a layer 270, which will be referred to hereinafter as "sixth process layer 270". The sixth process layer 270 is made of silver and has a thickness ranging, for example, between 3 µm and 8 µm. Further, the sixth process layer 270 may be obtained, for example, by electrolytic plating.

Figure 16:
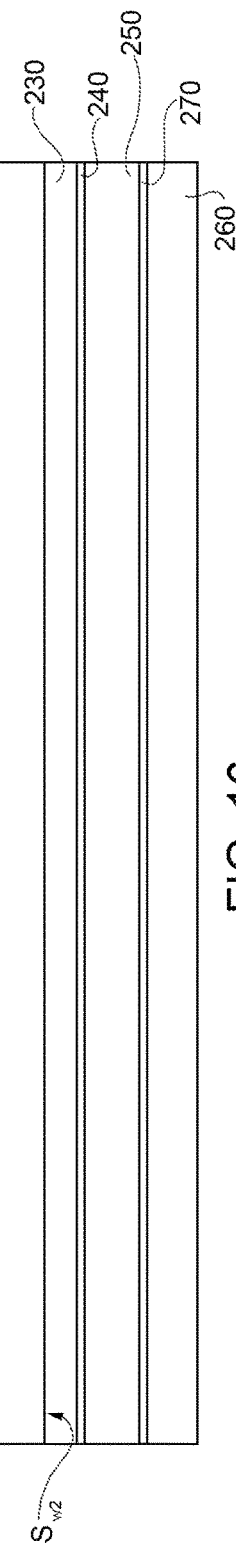

Next, as shown in FIG. 16, the plate 260 is coupled to the semiconductor wafer 50, in such a way that the sixth process layer 270 will contact the fifth process layer 250. In particular, the fifth process layer 250 is laid on the sixth process layer 270. For example, this coupling may be obtained after the patterned structure 70 has been coupled to the semiconductor wafer 50.

Figure 17:
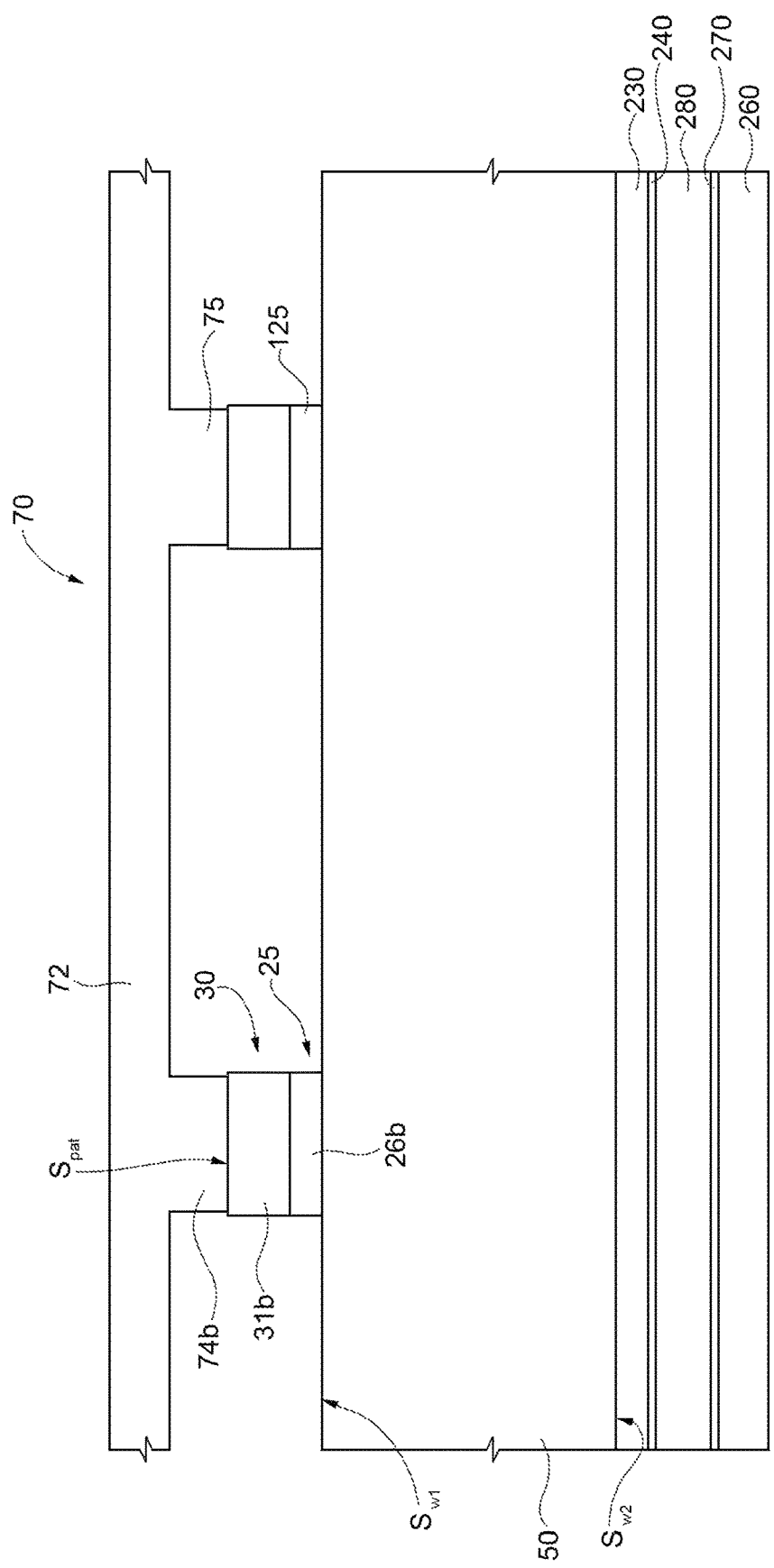

Next, execution of the thermal treatment designed to form the top buffer structure 30, mentioned with reference to FIG. 9, causes simultaneous formation, by the fifth process layer 250, of a bottom sintered layer 280, shown in FIG. 17. To a first approximation, the fourth and sixth process layers 240, 270 are not sintered, except for the atomic layers closest to the fifth process layer 250. Consequently, in the sequel of the present description their partial sintering is disregarded.

The subsequent operations of dicing (not shown) lead to formation of the bottom structure 130 and of the bottom metallization 140, starting from the bottom plate structure 230 and from the plate 260, respectively, as well as of the bottom buffer structure 135. In particular, the fourth, fifth, and sixth process layers 240, 250, 270 form the top portion 136, the intermediate portion 137, and the bottom portion 138, respectively, of the bottom buffer structure 135.

It is in any case possible for two distinct thermal treatments to be carried out to form, respectively, the top buffer structure 30 and the bottom sintered layer 280. Further, it is possible for the bottom buffer structure 135 to be made of a conductive material other than silver (for example, gold), in which case this material forms the fourth, fifth, and sixth process layers 240, 250, 270.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
a semiconductor body;
a top conductive region in contact with the semiconductor body;
a top buffer region positioned on the top conductive region, and on the semiconductor body, wherein the top buffer is at least partially sintered;
a front metallization region positioned on the top buffer region, the top buffer region being arranged between the front metallization region and the semiconductor body; and
a conductive wire electrically connected to the front metallization region, wherein said top buffer region includes:
a first layer on the top conductive region;
a second layer, made of a sintering paste, on the first layer;
a third layer contacting the second layer, wherein the first and third layers are made of a same material and the sintering paste including particles of said same material.

2. The device according to claim 1, wherein the metallization region has a thickness ranging between 35 µm and 65 µm.

3. The device according to claim 1, wherein the second layer has a thickness ranging between 27 µm and 42 µm.

4. The device according to claim 1, wherein the front metallization region and the conductive wire are made, respectively, of a first material and a second material having, respectively, a first linear coefficient of thermal expansion $CTE_{32}$ and a second linear coefficient of thermal expansion $CTE_{40}$, and where $CTE_{32}=CTE_{40}\pm10\%$.

5. The device according to claim 1, further comprising:
a bottom buffer region, the semiconductor body being arranged between the top buffer region and the bottom buffer region; and
a bottom metallization region positioned on the supporting element, the bottom buffer region being arranged between the semiconductor body and the bottom metallization region; and wherein the bottom buffer region is at least partially sintered.

6. The device according to claim 1, wherein the front metallization region is made of copper.

7. The device according to claim 1, further comprising a conductive wire electrically connected to the front metallization region.

8. The device according to claim 1, wherein the top buffer region is made of silver.

9. A process for manufacturing an electronic device, comprising:
forming a semiconductor body;
forming a front metallization region;
forming a top buffer region between the front metallization region and the semiconductor body;
forming a top conductive region in contact with the semiconductor body, wherein:
forming the top buffer region and front metallization region comprises:
forming a first layer on the semiconductor body;
forming a second layer on the first layer;
providing on the second layer a conductive structure including a main body and a cantilever portion, said cantilever portion being coated at least partially by a third layer, said providing the conductive structure being carried out in such a way that the third layer contacts the second layer; and
carrying out a sintering operation;
forming the top buffer region comprises forming the first layer on the top conductive region.

10. The process according to claim 9, comprising forming a top conductive region in contact with the semiconductor body, and wherein:
said second layer is made of a sintering paste; and
the first and third layers are made of a same material, the sintering paste including particles of said same material.

11. The process according to claim 9, wherein carrying out the sintering operation comprises sintering the second layer.

12. The process according to claim 9, wherein forming the front metallization region comprises removing said main body.

13. The process according to claim 9, further comprising:
forming a bottom metallization; and
forming a bottom buffer region between the semiconductor body and the bottom metallization, wherein forming the bottom buffer region comprises carrying out a sintering operation.

14. The process according to claim 13, comprising forming a bottom conductive structure in contact with the semiconductor body, wherein forming the bottom buffer region comprises:
forming a fourth layer in contact with the bottom conductive structure;
forming a fifth layer in contact with the fourth layer, said fifth layer being made of a sintering paste; and
providing a conductive plate coated at least partially by a sixth layer in such a way that the sixth layer will contact the fifth layer;
and wherein the fourth and sixth layers are made of a same material, the sintering paste of the fifth layer comprising particles of the same material.

15. An electronic device comprising:
a semiconductor body;
a first metallization region;
a conductive layer in contact with the semiconductor body; and
a first buffer region contacting the first metallization region and arranged between the first metallization region and the conductive layer, wherein said first buffer region comprises:
a first layer coupled to the semiconductor body;
a second layer in contact with the first layer, said second layer being a sintered layer; and
a third layer contacting the second layer, wherein the first and third layers are made of a same material, and the second layer includes particles of the same material.

16. The device according to claim 15, wherein the first metallization region is a conductive bonding pad configured to bond to a conductive wire.

17. The device according to claim 15, wherein the sintered layer has a thickness ranging between 27 µm and 42 µm.

18. The device according to claim 15, further comprising:
a second buffer region, the semiconductor body being arranged between the first buffer region and the second buffer region; and a second metallization region, the second buffer region being arranged between the semiconductor body and the second metallization region; and wherein the second buffer region is at least partially sintered.

19. The device according to claim 15, wherein the first metallization region is made of copper.

20. The device according to claim 15, wherein the first buffer region is made of silver.

* * * * *